(12) United States Patent
Asirvatham et al.

(10) Patent No.: US 8,196,024 B2
(45) Date of Patent: Jun. 5, 2012

(54) DEMAPPER USING FLOATING-POINT REPRESENTATION OF SOFT BITS

(75) Inventors: Kirupairaj Asirvatham, Escondido, CA (US); Peifang Zhang, San Diego, CA (US); Siavash Sheikh Zeinoddin, Calgary (CA); Peter J. Graumann, Calgary (CA)

(73) Assignee: Wi-LAN Inc., Ottawa, Ontario (CA)

( * ) Notice: Subject to any disclaimer, the term of this patent is extended or adjusted under 35 U.S.C. 154(b) by 1013 days.

(21) Appl. No.: 12/163,586

(22) Filed: Jun. 27, 2008

(65) Prior Publication Data

US 2009/0327820 A1 Dec. 31, 2009

(51) Int. Cl.
*H03M 13/03* (2006.01)
(52) U.S. Cl. .......................... 714/790; 708/204; 708/495
(58) Field of Classification Search .................. 714/790; 708/204, 495; 712/222
See application file for complete search history.

(56) References Cited

U.S. PATENT DOCUMENTS

| 5,021,785 | A | * | 6/1991 | Kohdaka et al. | 341/138 |
| 5,508,948 | A | * | 4/1996 | Hatta | 708/204 |
| 6,118,814 | A | * | 9/2000 | Friedman | 375/232 |
| 2006/0087961 | A1 | * | 4/2006 | Chang et al. | 370/203 |
| 2007/0110191 | A1 | * | 5/2007 | Kim et al. | 375/340 |

* cited by examiner

*Primary Examiner* — Sam Rizk
(74) *Attorney, Agent, or Firm* — Volpe and Koenig, P.C.

(57) ABSTRACT

The subject matter disclosed herein provides methods and systems for converting fixed-point soft bit values, provided by a demapper, into floating-point soft bits values. In one aspect, there is provided a method. The method may include receiving, from a demapper, soft bits formatted as a fixed-point value. Moreover, the soft bits may be converted from the fixed-point value to a floating-point value. The floating-point value is punctured to remove a bit. The converted soft bits are provided to a buffer to enable decoding of the buffered soft bits. Related systems, apparatus, methods, and/or articles are also described.

19 Claims, 9 Drawing Sheets

SOFT BIT CONVERTER

SECOND STAGE SOFT BIT CONVERTER

CONVERT TO 8-BITS FLOAT TO 8-BITS FIXED

DEMAPPER USING FLOATING-POINT REPRESENTATION OF SOFT BITS

FIELD

The subject matter described herein relates to wireless communications.

BACKGROUND

A value can be represented in various formats, such as in a fixed-point format or a floating-point format. The fixed-point format refers to using an integer part and a fractional part. For example, the 16 most significant bits of a 32-bit binary number can be used to represent the integer, while the 16 least significant bits can be used to represent the fractional part. In the case of binary fixed-point numbers, each integer bit represents a power of two, while each fractional bit represents an inverse power of two. For example, the first fractional bit is ½, the second is ¼, the third is ⅛, and so forth.

Typically, signed fixed-point numbers use a two's complement format, as depicted in Table 1 below, to represent positive and negative values. When two's complement arithmetic is used, the first bit represents the sign bit. Referring to the first row of Table 1, the sign bit of binary value 0000 0101 is "0," which in two's complement represents a positive value. The remaining bits, 000 0101, have a value of 5 (i.e., $1*2^0 + 0*2^1 + 1*2^2 + 0*2^3 + 0*2^4 + 0*2^5 + 0*2^6 = 5$). Rows 2-5 depict other examples of base-ten numbers and the corresponding two's complement binary values. Row 6 depicts the all zero case, while rows 7-11 depict examples of negative base-ten numbers and their corresponding two's complement binary numbers. The sign bit of "1" in the binary values of rows 7-11 represents a negative value. Although Table 1 only depicts values between 5 and −5, a two's-complement can represent other values as well.

TABLE 1

Example of Base Ten Values and Corresponding Two's Complement Binary Values

| Row | Base Ten Value | Binary Value |
| --- | --- | --- |
| 1 | 5 | 0000 0101 |
| 2 | 4 | 0000 0100 |
| 3 | 3 | 0000 0011 |
| 4 | 2 | 0000 0010 |
| 5 | 1 | 0000 0001 |
| 6 | 0 | 0000 0000 |
| 7 | −1 | 1111 1111 |
| 8 | −2 | 1111 1110 |
| 9 | −3 | 1111 1101 |
| 10 | −4 | 1111 1100 |
| 11 | −5 | 1111 1011 |

A value may also be represented as a floating-point value by using a sign bit, a mantissa (also referred to as a significand or a coefficient), and an exponent. For example, the number 123.45 can be represented as a decimal floating-point number with a mantissa of 12345 and an exponent of −2 (i.e., $12345 \times 10^{-2}$). In the case of binary floating-point numbers, these numbers are typically stored in a format having a sign bit, a mantissa, and an exponent. There are various standards that define the format for floating-point binary values. One of those standards is IEEE Standard for Binary Floating-Point Arithmetic (ANSI/IEEE Std 754-1985). Although most computers perform computations using floating-point processors for processing floating-point binary values, many smaller, embedded processors, such as the embedded processors used in some telecommunication devices (e.g., base stations, client stations, handsets, and the like), are not capable of processing floating-point values, and, as such, use fixed-point values.

SUMMARY

The subject matter disclosed herein provides methods and apparatus for converting fixed-point soft bit values into floating-point soft bits values.

In one aspect, there is provided a method. The method may include receiving, from a demapper, soft bits formatted as a fixed-point value. Moreover, the soft bits may be converted from the fixed-point value to a floating-point value. The floating-point value is punctured to remove a bit. The converted soft bits are provided to a buffer to enable decoding of the buffered soft bits.

In another aspect, there is provided a system. The system includes means for receiving, from a demapper, soft bits formatted as a fixed-point value. The system further includes means for converting the soft bits from the fixed-point value to a floating-point value, the floating-point value punctured to remove a bit. The system further includes means for providing the converted soft bits to a buffer to enable decoding of the buffered soft bits.

In another aspect there is provided a system. The system includes a demapper configured to provide soft bits formatted as a fixed-point value. The system further includes a first soft bit converter configured to receive, from the demapper, the soft bits formatted as the fixed-point value and convert the soft bits from the fixed-point value to a floating-point value, the conversion including puncturing a bit of the floating-point value. Moreover, the system includes a buffer configured to receive the converted soft bits to enable decoding of the buffered soft bits.

Variations of the above aspects may include one or more of the following features. The fixed-point value of soft bits may be received from the demapper as an integer part and a fractional part. The conversion from fixed-point values to floating-point values may include determining the floating-point value as a mantissa and an exponent. Moreover, the conversion from fixed-point values to floating-point values may include determining an exponent based on a location of a most significant bit of the received soft bits and determining a mantissa using a sign bit and one or more bits adjacent to the most significant bit, the most significant bit being punctured from the mantissa to remove the bit. The floating-point value may be provided to a buffer to represent the soft bits. A block including a plurality of floating-point values representing soft bits may be received from the buffer, such that the block is decoded by a forward error correction (FEC) decoder. The block including the plurality of floating-point values may be converted to another block comprising a plurality of fixed-point values. The conversion from floating-point to fixed-point may include inserting a bit representing a punctured bit, determining an average exponent based on a plurality of exponents, and inserting the mantissa into the fixed-point value. The insertion may include inserting the mantissa at a location in the fixed-point value, the location determined based on the average exponent, a scale factor, or a combination of both. The other block of fixed-point values may be provided to the forward error correction (FEC) decoder. The forward error correction (FEC) decoder may be implemented as a convolution turbo code (CTC) decoder.

The details of one or more variations of the subject matter described herein are set forth in the accompanying drawings and the description below. Features and advantages of the subject matter described herein will be apparent from the description and drawings, and from the claims.

Figure 1:
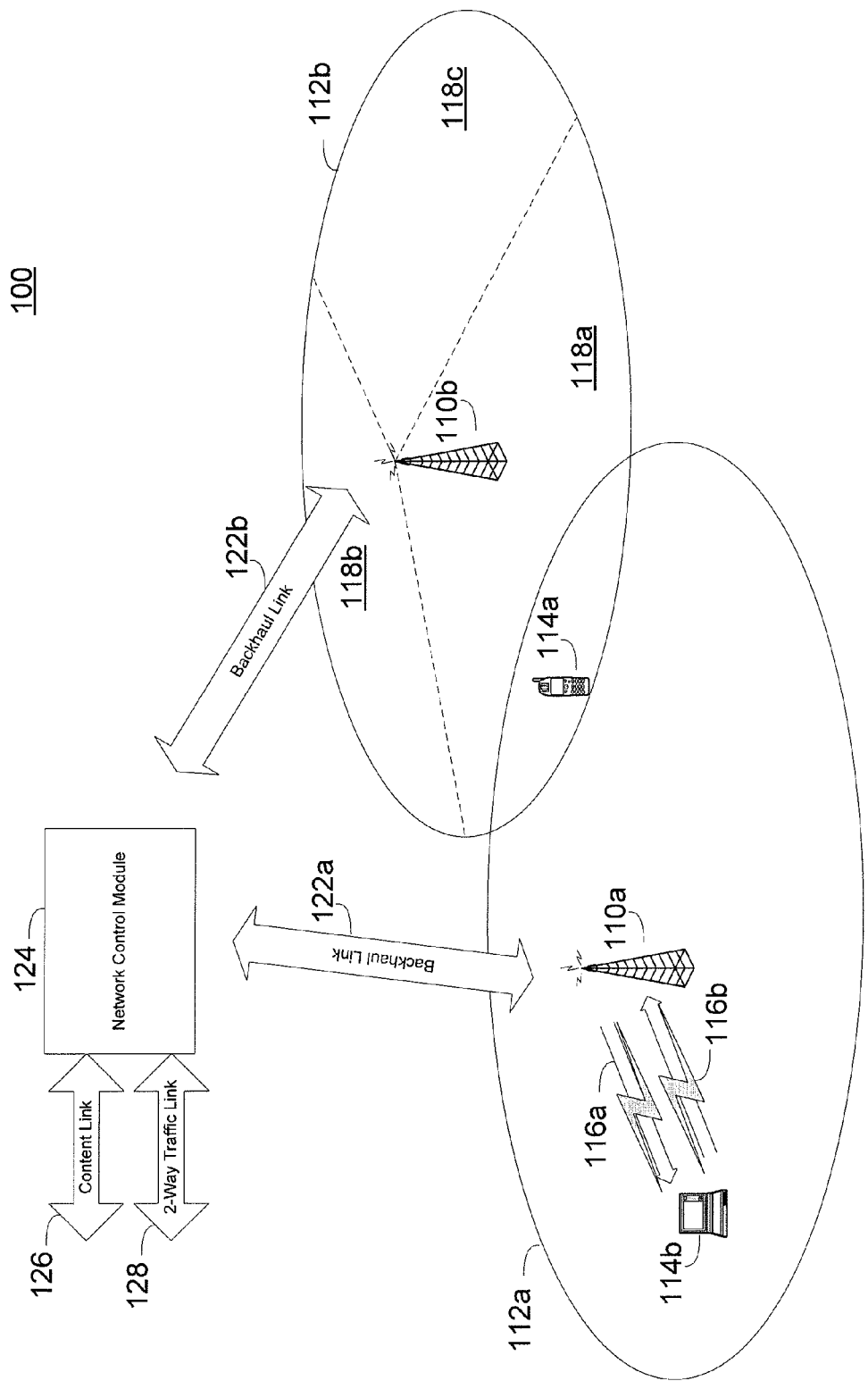
FIG. 1 depicts an example of a network including client stations and base stations.

Like labels are used to refer to same or similar items in the drawings.

DETAILED DESCRIPTION

DEFECs (de-forward error correction circuits also referred to as "forward error correction decoders") typically use soft bits when decoding. For example, in a QPSK system, each QSPK signal may comprise two bits. Instead of using only two bits to decide which QPSK signal was transmitted, decoders using soft bits use additional bits, such as 4, 8, 20, or more soft bits. In typical systems, the number of soft bits used is selected to provide sufficient range to accommodate the best case and worst case scenarios with respect to errors in the communication link over which the signal is transmitted. The amount of information (represented by the bit length of the soft bits) carried by these soft bits may, however, be less than the amount of information actually required to accommodate both the best and worst case scenarios of the communication link.

The subject matter described herein relates converting each of the soft bits provided by a demapper from a fixed-point value into a floating-point value. For example, in some embodiments, the soft bits may be converted into a 4-bit mantissa value and a 4-bit exponential value, although other sizes of floating-point values may be used as well. Moreover, in some embodiments, the floating-point representation of the soft bits are punctured before being stored in a buffer, thus significantly saving storage when compared to using fixed-point soft bits or un-punctured floating point soft bits. The buffered soft bits are then provided as a block to a FEC decoder. In some implementations, a second stage soft bit converter is also used to convert the floating-point soft bits stored in the buffer to fixed-point soft bits, so that the FEC decoder can process fixed-point values rather than floating-point values. In implementations where the FEC decoder can decode floating-point values, the second stage soft bit converter may be disabled.

FIG. 1 is a simplified functional block diagram of an embodiment of a wireless communication system 100. The wireless communication system 100 includes a plurality of base stations 110a and 110b, each supporting a corresponding service or coverage area 112a and 112b. The base stations are capable of communicating with wireless devices within their coverage areas. For example, the first base station 110a is capable of wirelessly communicating with a first client station 114a and a second client station 114b within the coverage area 112a. The first client station 114a is also within the coverage area 112b and is capable of communicating with the second base station 110b. In this description, the communication path from the base station to the client station is referred to as a downlink 116a and the communication path from the client station to the base station is referred to as an uplink 116b.

Although for simplicity only two base stations are shown in FIG. 1, a typical wireless communication system 100 includes a much larger number of base stations. The base stations 110a and 110b can be configured as cellular base station transceiver subsystems, gateways, access points, radio frequency (RF) repeaters, frame repeaters, nodes, or any wireless network entry point.

The base stations 110a and 110b can be configured to support an omni-directional coverage area or a sectored coverage area. For example, the second base station 110b is depicted as supporting the sectored coverage area 112b. The coverage area 112b is depicted as having three sectors, 118a, 118b, and 118c. In typical embodiments, the second base station 110b treats each sector 118 as effectively a distinct coverage area.

Although only two client stations 114a and 114b are shown in the wireless communication system 100, typical systems are configured to support a large number of client stations. The client stations 114a and 114b can be mobile, nomadic, or stationary units. The client stations 114a and 114b are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter reading equipment or the like in may include a display mechanism, microphone, speaker and memory.

In a typical system, the base stations 110a and 110b also communicate with each other and a network control module 124 over backhaul links 122a and 122b. The backhaul links 122a and 122b may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only.

As used herein, IEEE 802.16 refers to one or more specifications, such as the Institute of Electrical and Electronic Engineers (IEEE) Standard for Local and metropolitan area networks, Part 16: Air Interface for Fixed Broadband Wireless Access Systems, 1 Oct. 2004, IEEE Standard for Local and metropolitan area networks, Part 16: Air Interface for Fixed and Mobile Broadband Wireless Access Systems, 26 Feb. 2006, and any subsequent additions to the IEEE 802.16 series of specifications.

In some embodiments, downlink 116a and uplink 116b each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as subchannels or tones). The subcarriers are modulated using BPSK (binary phase shift keying), QPSK (quadrature phase shift keying), QAM (quadrature amplitude modulation), and carry symbols including data coded using a forward error correction code.

The phrase "soft bits" refers to using additional bits (i.e., the soft bits) to provide additional information for use by a decoder, such as a forward error correction decoder, when decoding received data. For example, in the case of a simple BPSK signal, noise may influence binary signal during transmission, so that a transmitted bit, such as a "0," is received as a "1." In this example, additional soft bits can be used to represent the received data with more than a single bit. The soft bits thus provide additional information to help determine the received data value.

Referring to the previous BPSK example, soft bits can provide additional bits so that uncertain values near the decision boundary (e.g., between a 0 and 1) do not affect the decoding to the same extent as a value farther away from the decision boundary. Specifically, the soft bits are used to determine the likelihood of whether a received signal (or sample value) is likely to be a given symbol, such as a zero ("0") or a one ("1"). For example, an 8-bit soft bit value can be used to represent 256 levels, so that a soft bit value of −127 means "most likely a 0," a soft bit value of −100 means "likely a 0," a soft bit value of 0 means "it could be either 0 or 1," a soft bit value of 100 means "likely 1", a soft bit value of 127 means "most likely 1." Thus, the soft bits (also referred to as "soft decisions" and/or "soft metrics") provide additional information to aid a decoder, such as a FEC decoder, to decode the received signal into a symbol.

Figure 2:
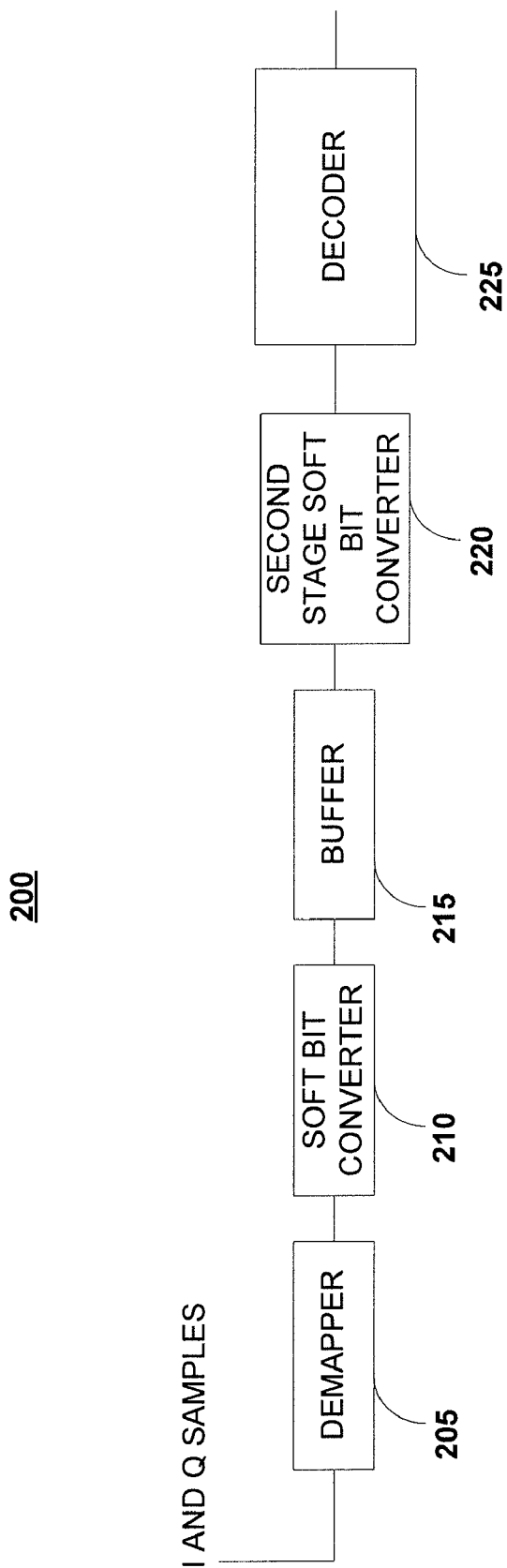
FIG. 2 depicts a system for using floating-point values when demapping received samples.

FIG. 2 depicts a system 200 including a demapper 205, a soft bit converter 210, a buffer 215, a second stage soft bit converter 220, and a decoder 225. The system 200 may be implemented in connection with the receiver of any communication link, such as the communication links depicted at wireless system 100. For example, system 200 may be implemented at the receiver of client station 114b to receive downlink 116a and/or implemented at the receiver of base station 110a to receive uplink 116b. Although FIG. 2 depicts a soft bit converter 210, a buffer 215, a second stage soft bit converter 220 as separate from demapper 205, in some implementations one or more of soft bit converter 210, a buffer 215, and second stage soft bit converter 220 may be incorporated into demapper 205

The demapper 205 receives I and Q samples from an RF front-end comprising an antenna to receive an RF signal including a symbol transmitted by a transmitter, an analog-to-digital converter to convert the RF signal received via the antenna to a digital format, and a Fast Fourier Transform (FFT) module to transform the digital formatted data into I and Q samples. The I and Q samples represent the receiver's estimate of the symbol (i.e., the real and imaginary parts of a received symbol). The demapper 205 performs a constellation demapping of the I and Q samples, which results in an output of soft bits for each of the I and Q samples.

Figure 3:
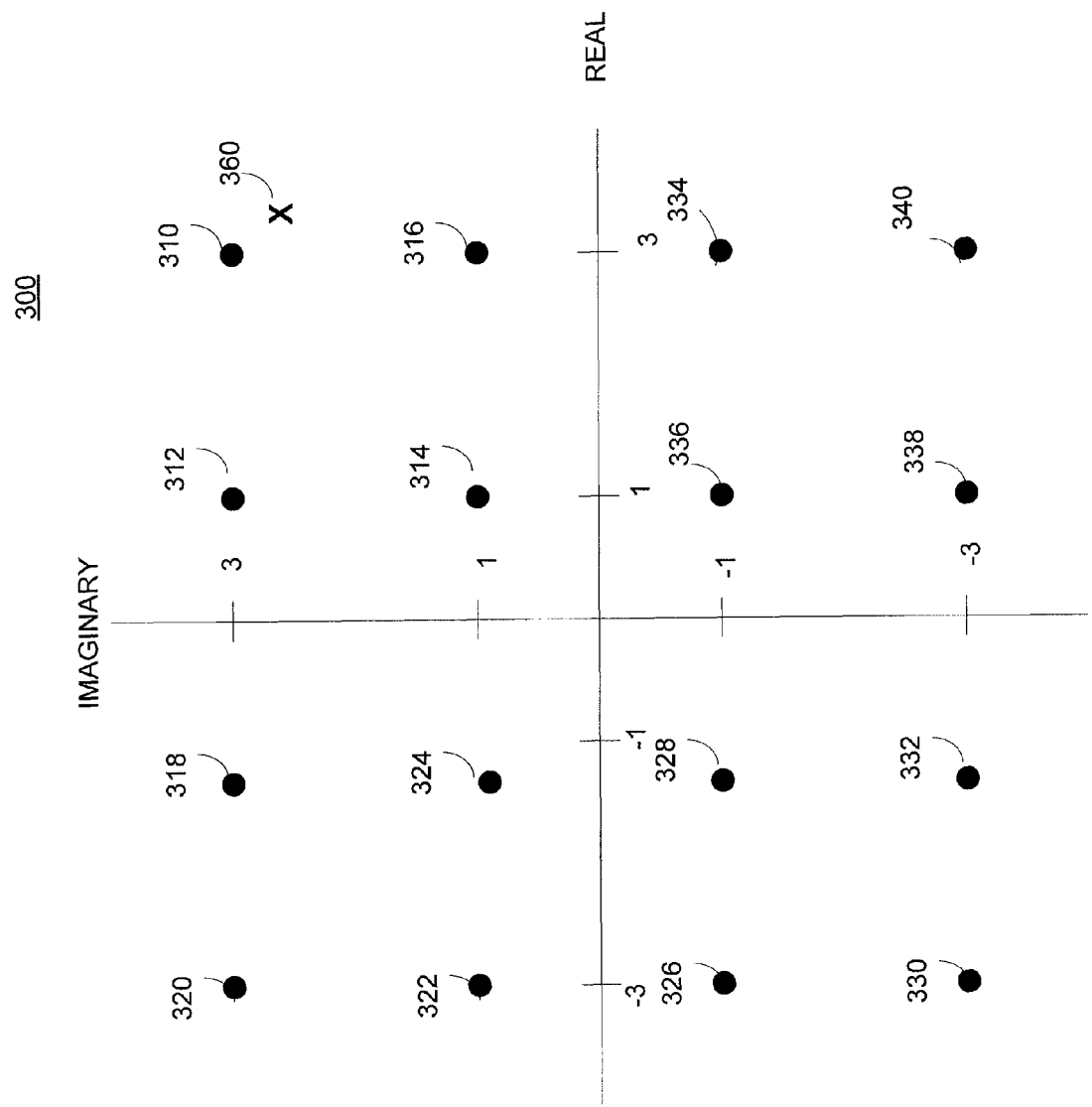
FIG. 3 is a plot of a constellation demapped into soft bits to enable buffering and decoding by a forward error correction decoder.

FIG. 3 depicts a constellation 300 of symbols 310-360 for a 16-ary QAM (16-QAM) signal sent by a transmitter and then received at a receiver including system 200. For example, the I and Q sample X 360 represents a received symbol that is provided to system 200. Moreover, I and Q sample X 360 has a real part and an imaginary part, as indicated by the real horizontal axis and the imaginary vertical axis. When soft bits are used, demapper 205 outputs soft bits to enable a determination of whether the I and Q sample represented by X 360 is likely to be symbol 310 or some other symbol, such as symbol 316. Demapper 205 thus demaps the I and Q sample to soft bits, which are later processed by modules 210-220 and then decoded by a FEC decoder, such as decoder 225. The soft bits may be of any length, such as length of 4-bits, 8-bits, 20-bits, and the like.

Referring again to FIG. 2, soft bit converter 210 converts soft bits provided by demapper 205 into a format for buffering in buffer 215. For example, soft bit converter 210 converts soft bits formatted as a fixed-point value into a floating-point value, which is then stored in buffer 215. Moreover, soft bit converter 210 may perform puncturing of any converted soft bits. In some embodiments, a most significant bit (MSB) may be punctured from the floating-point value, such as a MSB located after the sign bit. In some implementations, the conversion to floating-point and the puncturing of the one or more soft bits saves storage space in the buffer 215. Because the soft bits provide additional information by using additional bits, each soft bit punctured enables the use of a smaller sized buffer 215, reducing thus the cost of the system 200 and improving performance.

Buffer 215 (also referred to as a mailbox) stores one or more soft bits converted by soft bit converter 210. The buffer 215 holds the soft bits until a block is formed for decoding by a decoder, such as decoder 225. For example, buffer 215 may accumulate a block including n 20-bit soft bits, where n represents the number of soft bits in a block to be decoded by a decoder, such as decoder 225. In some implementations, the maximum value of n is 14,400, such that there are 14,400 soft bits in the buffer 215, although other values of n may be used as a well.

Second stage soft bit converter 220 converts the soft bits of the block stored in the buffer 215 into a format that can be decoded by decoder 225. For example, second stage soft bit converter 220 converts the punctured, floating-point soft bits stored at buffer 215 into fixed-point values for decoding by decoder 225. Moreover, second stage soft bit converter 220 may reinsert into the soft bits any bits punctured by soft bit converter 210. Although the given example describes using a negative two's complement binary number, a positive two's complement can be used as well. Moreover, when the soft bits correspond to a two's complement binary value of all zeros or all ones, soft bit converter 210 will detect that change. For example, in case of the soft bits being all zeros, the exponent is set to a maximum value of all ones, and the mantissa is set to zero. If the soft bits are all ones, the exponent is set to zero, and the resulting mantissa is set to three (e.g., 0011).

Decoder 225 may be implemented as any type of decoder, such as a FEC decoder, for correcting and detecting errors. Examples of such decoders include a convolution decoder, a Reed-Solomon decoder, convolutional turbo code (CTC) decoder, or any other decoder including decoders consistent with IEEE 802.11. The forward error corrected output of decoder 225 may be any type of data, such as packets, voice, video, or any other information as well. Moreover, the forward error corrected output of decoder 225 may be further processed and then provided to a media access control (MAC) layer interface as payload data units (PDUs).

Figure 4:
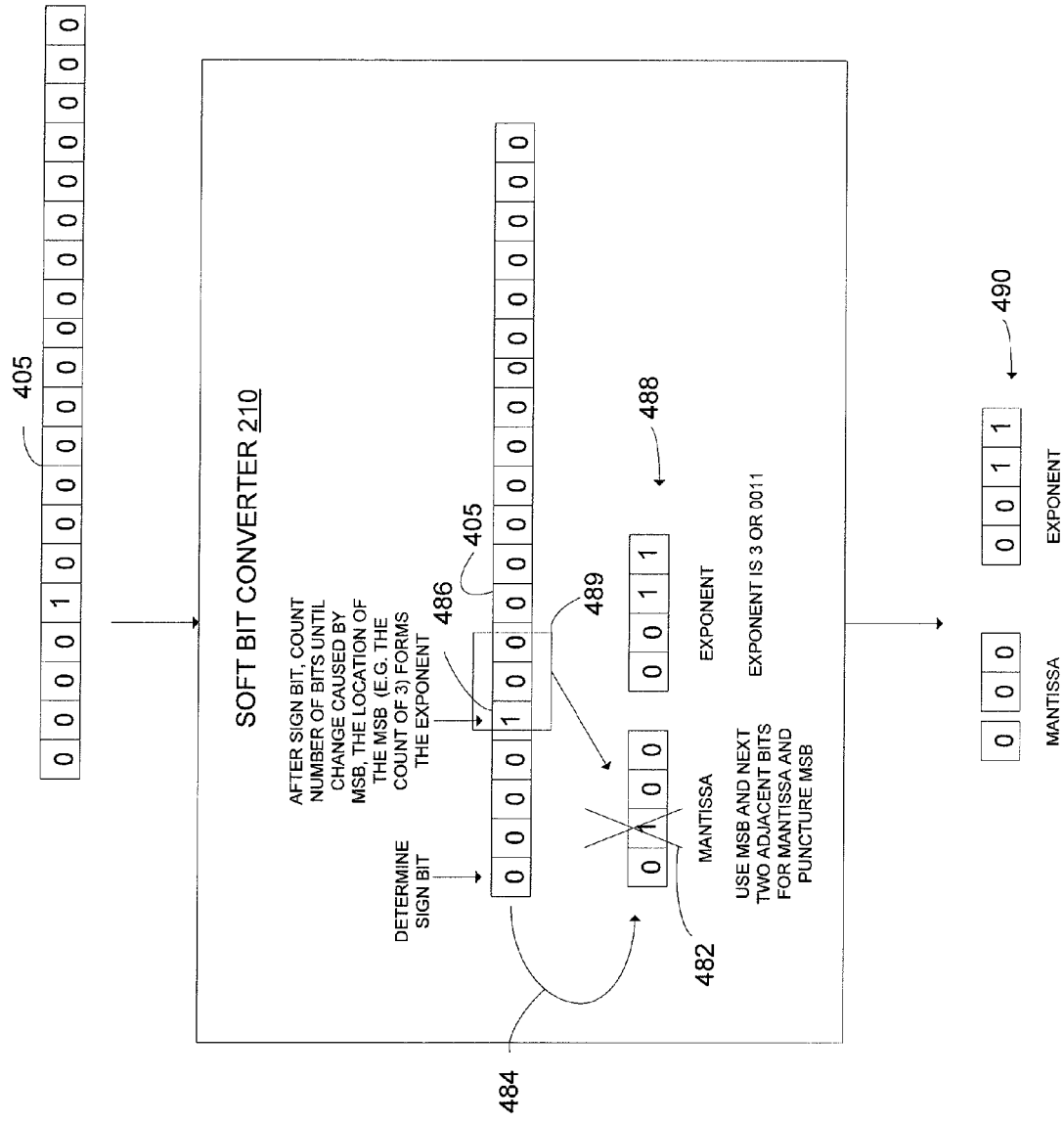
FIG. 4 depicts a block diagram of a soft bit converter for converting soft bits from fixed-point values to floating-point values.

FIG. 4 depicts a block diagram of an exemplary implementation of soft bit converter 210. Referring to FIG. 4, demapper 205 provides to soft bit converter 210 soft bits resulting from a demapping of an I and Q sample. FIG. 4 depicts the case when the soft bits are provided by demapper 205 as a 20-bit fixed-point value 405, although other output formats may be provided by demapper 205 including other sizes, such as an 8-bit fixed-point value. Soft bit converter 210 converts the received soft bits 405 from a 20-bit fixed-point value into a floating-point value 488 including a mantissa and an exponent. The floating-point value 488 is then punctured 482 to remove a most significant bit (i.e., the MSB after the sign bit) of the mantissa to form the floating-point value 490. The floating-point value 490 is then provided to buffer 215 for storage.

Figure 5:
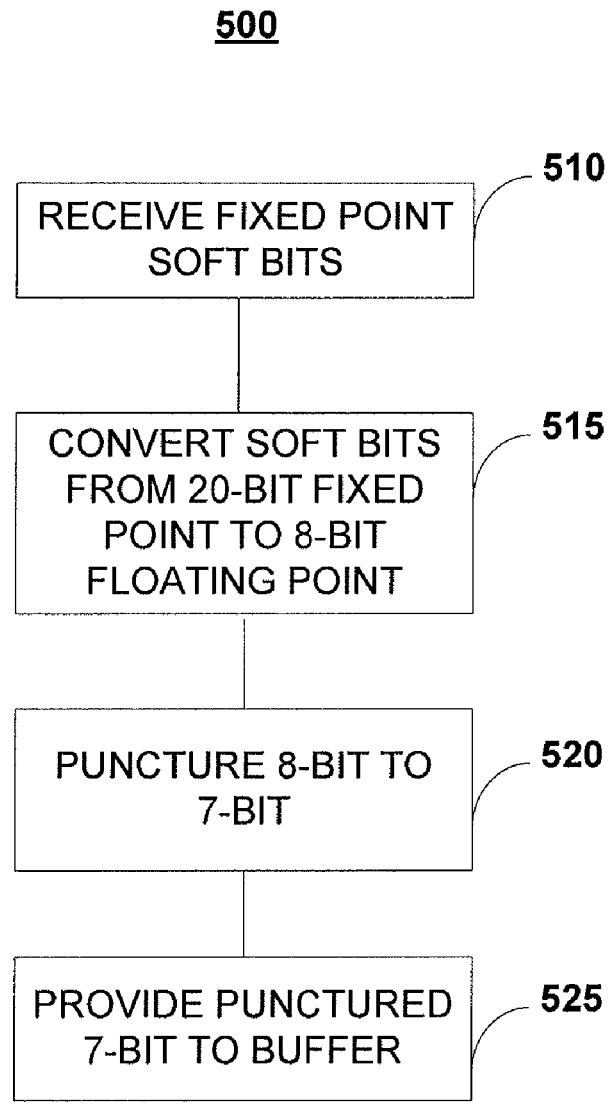
FIG. 5 depicts a process 500 for converting soft bits from fixed-point values to floating-point values including puncturing the converted floating-point values to save storage space in a buffer.

FIG. 5 depicts an exemplary process 500 for use by the soft bit converter 210 to convert received soft bits from a fixed-point format to a floating-point format.

Referring to FIGS. 4 and 5, at 510, soft bit converter 210 receives soft bits from demapper 205. For example, the soft bits may be a fixed-point value that is 20-bits long, such as soft bits 405, although other values and lengths may be used as well.

At 515, the soft bit converter 210 converts the received soft bits 405 from a fixed-point value into a floating-point value. For example, the soft bit converter 210 may convert soft bits 405 from a fixed-point value that is 20-bits long into an 8-bit floating-point value. To perform the conversion, the soft bit converter 210 may first determine the sign bit 484 of the received soft bits 405. The sign bit 484 represents, in a two's complement numbering scheme, the sign of the soft bits 405. The sign bit 484 is also used to form the soft bits 488 formatted in floating-point. Next, the soft bit converter 210 counts the number of bits until a change occurs as a result of a MSB (i.e., the MSB after the sign bit) of the fixed-point soft bits 405. In the example of FIG. 4, after the sign bit, the MSB is "1" 486 and the count is 3. In other words, in the example of FIG. 4, the process counts the number of bits from the sign bit (in this case a 0) until a bit is reached with the opposite value (in this case a 1) of the sign bit. Soft bit converter 210 then inserts MSB 486 and one or more adjacent bits into the mantissa of the floating-point soft bits 488. The value "100" 489 thus forms the MSB and the adjacent bits, which are inserted into the mantissa portion of the floating-point soft bits 488. As noted, soft bit converter 210 also counts the number of shifts from the sign bit 484 until the MSB 486 is detected. In the example of FIG. 4, the soft bit converter 210 moves to the right 3 bits until the MSB 486 is detected. The number of shifts, in this case "3", forms the exponent of the floating-point soft bits 488. In this example, soft bit converter 210 inserts, into the exponent of floating-point soft bits 488, the value 3 as a binary "0011" (i.e., 3 base-ten has the binary value of 0011). The received 20-bit fixed-point value 405 is thus converted by soft bit converter 210 into an 8-bit floating-point number 488 including a mantissa and an exponent.

At 520, soft bit converter 210 may then puncture one or more bits of the converted floating-point value. In the example of FIG. 4, soft bit converter 210 punctures (i.e., removes) the MSB 482 to decrease the size of the floating-point soft bits 488 by a bit. In the example of FIG. 4, the 8-bit floating-point soft bits 0100 0011 488 is punctured to generate 7-bit floating-point soft bits 490 having the value of 000 0011. This bit (i.e., the bit of the mantissa immediately following the sign bit) can be punctured because in this example, the MSB is the opposite value of the sign bit and therefore can be eliminated without loss of information.

At 525, soft bit converter 210 provides the floating-point soft bits 490 to buffer 215 for storage, so that a block of soft bits can be formed for decoder 225. In the example of FIG. 4, the MSB 482 is punctured to generate 7-bit floating-point soft bits 490 (comprising a 3 bit punctured mantissa and a 4 bit exponent), which is then provided to buffer 215 for storage. The 7-bit floating-point value 490 is stored in the buffer until buffer 215 includes a block having a sufficient amount of soft bits to enable decoding by decoder 225.

When a block of soft bits is formed in buffer 215, a second stage soft bit converter 220 receives from buffer 215 the block of one or more soft bits. Decoders typically decode in blocks, which can vary in size based on the specific decoder implemented. As such, buffer 215 holds the soft bits until a block (also referred to as a FEC block) is formed. When the soft bits of the block are received from the buffer 215, second stage soft bit converter 220 converts the punctured floating-point soft bits values of the block to fixed-point values that can be decoded by the decoder 225.

Figure 6:
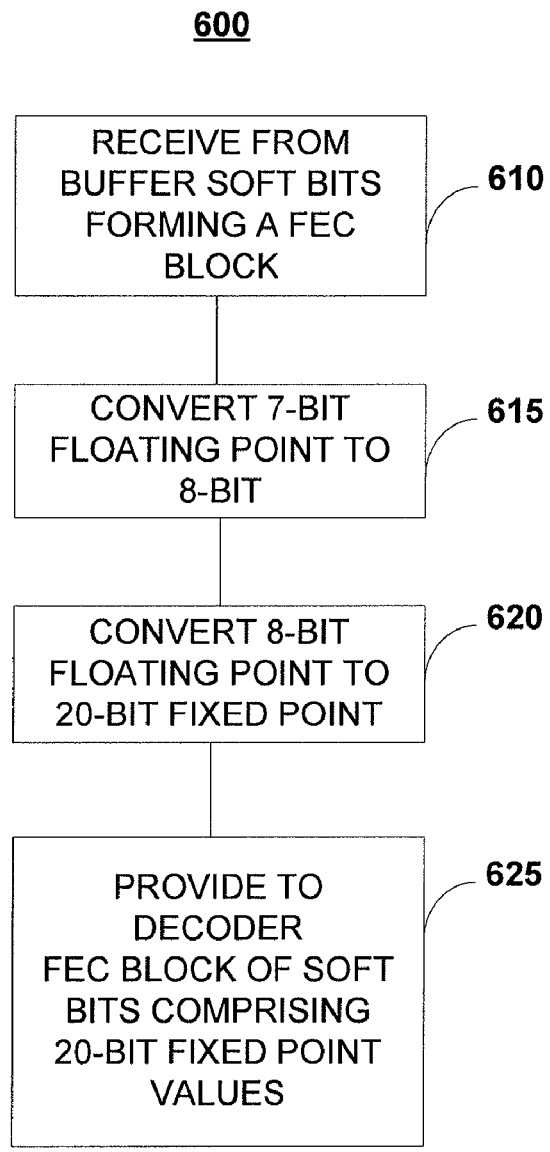
FIG. 6 depicts a process 600 for converting the buffered soft bits from floating-point values to fixed-point values to enable decoding by a forward error correction decoder.

FIG. 6 depicts an exemplary process 600 for converting the punctured floating-point soft bits received from the buffer 215 to fixed-point soft bits, so that the block can be decoded by the decoder 225.

At 610, the second stage soft bit converter 220 receives from the buffer 215 a block of one or more soft bits to be decoded by the decoder 225. In some implementations, the block includes one or more soft bits, each of which is a 7-bit floating-point value, such as floating-point soft bits 490.

At 615, the received fixed-point value is converted to an 8-bit value. Specifically, the second stage soft bit converter 220 converts, for each of the soft bits in the block, the 7-bit punctured floating-point soft bits to 8-bit floating-point soft bits by inserting a bit to replace the punctured bit of FIG. 5 at 520. As noted above, in the present example, this bit will be the opposite of the sign bit (i.e., the first bit of the mantissa). At 620, the second stage soft bit converter 220 converts the 8-bit floating-point soft bits to 20-bit fixed-point soft bits. At 625, the second stage soft bit converter 220 provides to decoder 225 the converted 20-bit fixed-point soft bits.

Figure 7:
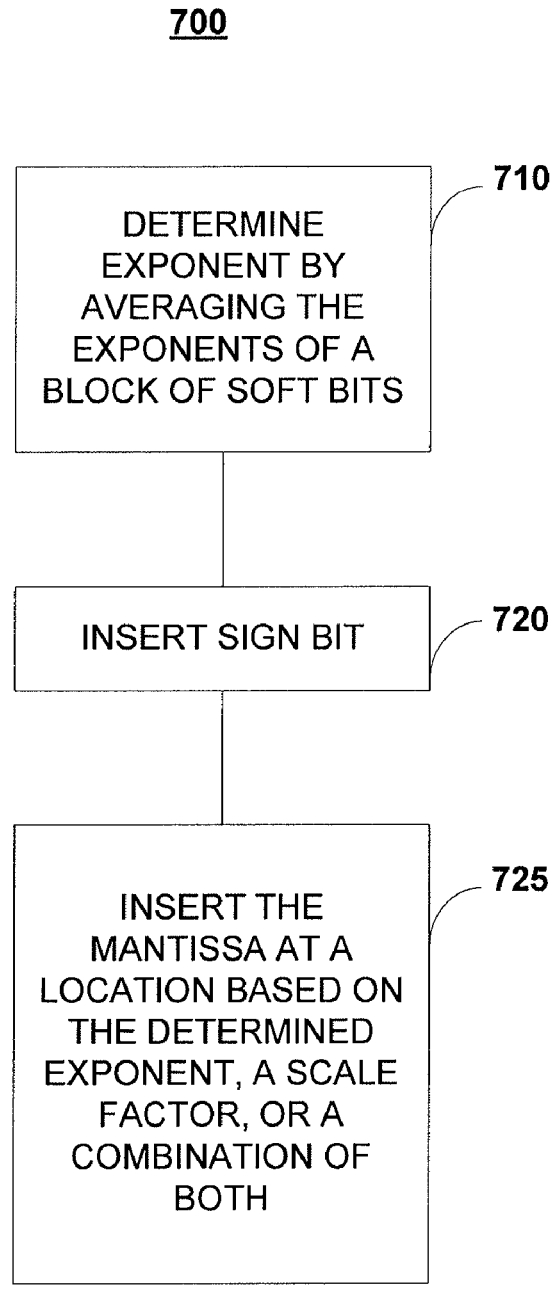
FIG. 7 depicts a process 700 for converting floating-point values into fixed-point values.

Although various approaches may be used to perform the conversion of 620 from floating-point to fixed-point, in some implementations, the process 700 of FIG. 7 may be used to convert the floating-point soft bits to fixed-point soft bits.

Moreover, although FIGS. 6 and 7 are described as a conversion from 8-bit floating-point soft bits to 20-bit fixed-point soft bits, other lengths of soft bits may be used as well.

Figure 8:
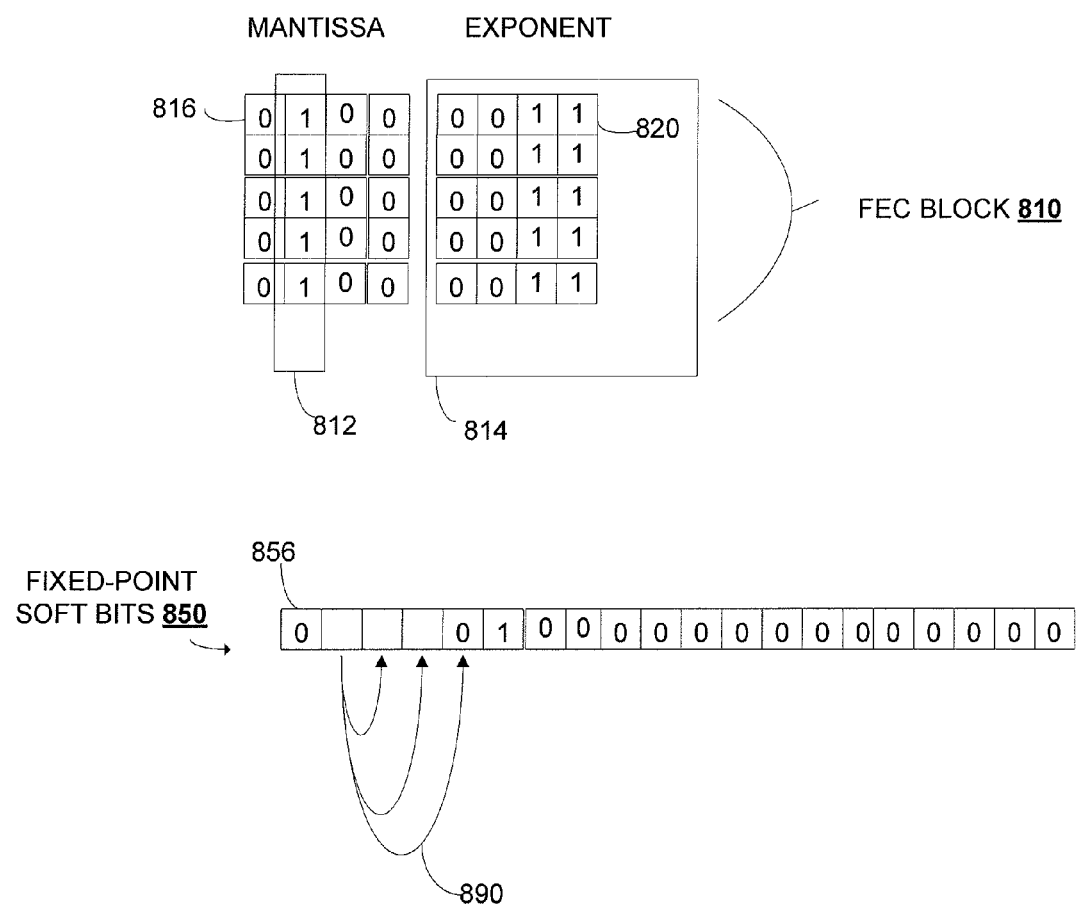
FIG. 8 depicts an example of a forward error correction block converted to a floating point value.

FIG. 8 depicts an example of a block, namely a FEC block 810. Referring to FIGS. 7 and 8, at 710, second stage soft bit converter 220 determines an exponent by averaging the exponents of one or more soft bits of a block. The rows of the FEC block 810 correspond to floating point soft bits generated by soft bit converter 210 and stored at buffer 215. For example, the first row 810 includes the 7-bit floating-point soft bits 490 with the addition of the reinserted punctured bit—forming thus 0100 0011 at the first row 820. The column 812 corresponds to the inserted MSBs, which was punctured as described above at 615.

To average the exponents, second stage soft bit converter 220 determines the average of the exponents of the FEC block 810. For example, an average is determined for the exponents 814 using the following equation:

$$\overline{exp} = \left(\sum_{i}^{n} exp\right)/n$$

wherein $\overline{exp}$ represents the average exponent, exp represents the exponent portion 814 of a row of FEC block 810, i represents the $i^{th}$ row of the FEC block 810, and n represents the total number of rows. In the example of FIG. 8, n is equal to 5 and the average exponent would be equal to 3 (i.e., (0011+ 0011+0011+0011+0011)/5=3). Although the example of FIG. 8 depicts 5 rows, blocks of other sizes may be used as well. Moreover, although FIG. 8 depicts the FEC block 810 as an 8-bit floating-point value, in some implementations, the FEC block 810 may only include 7-bit floating-point values without any punctured bits being reinserted (e.g., the punctured bits of the mantissa can be re-inserted after process 700).

At 720, the second stage soft bit converter 220 inserts, for each of the soft bits of the block, a sign bit. For example, for the first row 820 of soft bits of block 810, the second stage soft bit converter 220 inserts the sign bit "0" 816 into the sign bit 856 of the fixed-point soft bits 850. The second row, the third row, and so forth would also be processed in accordance with process 700, so that each row of block 810 has a corresponding fixed-point value converted in accordance with process 700.

At 725, the mantissa of the soft bit is then inserted at a location based on the average exponent value determined at 710, a scale factor, or a combination of both. The scale factor takes into account the modulation type being used. The mantissa of the first row 820 is 0100. That mantissa is inserted by the second stage converter 220 into fixed-point soft bits 850 at a location based on the average exponent, the scale factor, or a combination of both. Referring to the previous example, the average exponent is 3. As such, the mantissa is inserted at a location that is 3 bits from the sign bit given a scale factor of zero (e.g., the location is determined as the average exponent value minus the scale factor). FIG. 8 depicts the mantissa inserted by shifting (as depicted by arrows 890) the mantissa three positions to the right of the sign bit 856. When the scale factor is used, the scale factor may be used to adjust the location of the mantissa based on the type of modulation used. For example, a simple modulation scheme, such as BPSK, may use a scale factor of 0, while a QPSK may use another value, such as 2, and QAM may use another value as well, such as 4.

Although the example of FIG. 8 is described with respect to 20-bit soft bits 850, other lengths of fixed-point values may be used as well.

Once each of the soft bits of a block are converted from a floating-point format into a fixed-point format (e.g., using process 700), each of the soft bits of the block are provided to a decoder 225 for forward error correction. The output of decoder 225 is then provided as data, such as payload data units (PDUs) for a media access layer (MAC) layer interface at the receiver.

Figure 9:
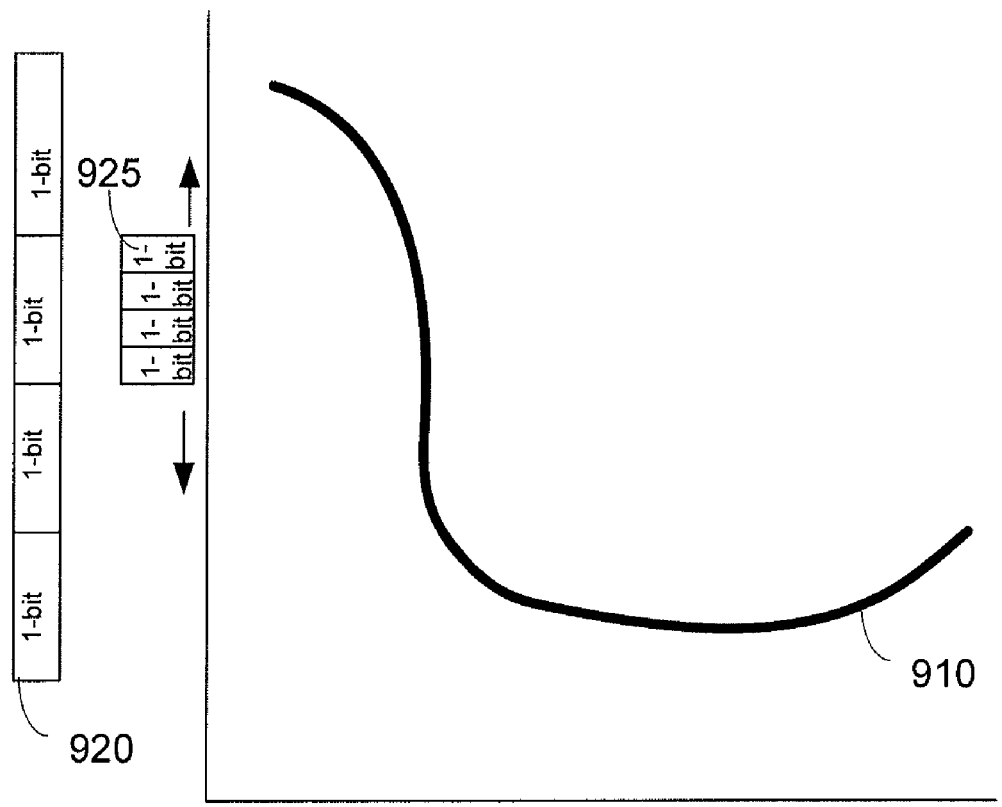
FIG. 9 depicts a plot of the mantissa and the exponent of a converted floating-point value.

FIG. 9 depicts a plot representing that fixed point values 910 may be converted to floating point, so that exponent 920 preserves the information corresponding to the range of the fixed point values 910, while the mantissa 925 preserves the information corresponding to the information of interest in the fixed point values 910. Moreover, the fixed point values 910 show that the large signal variations are captured by the large number of bits used in the fixed point. The mantissa and exponent allows the range to cover a wide range of bits (e.g., the mantissa plus $2^{exponent}$ number of bits). In this case with an exponent of 4 and virtual mantissa of 4, the floating point representation can be used to cover virtually 20 bits.

The subject matter described herein may be embodied in systems, apparatus, methods, and/or articles depending on the desired configuration. In particular, various implementations of the subject matter described herein may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, system 200 (or the modules therein) as well as processes 500-700 may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

What is claimed:

1. A method comprising:
receiving, from a demapper, soft bits formatted as a fixed-point value;
converting the soft bits from the fixed-point value to a floating-point value, the floating-point value punctured to remove a bit; and
providing the converted soft bits to a buffer to enable decoding of the buffered soft bits.

2. The method of claim 1, wherein receiving further comprises:
receiving, from the demapper, the fixed-point value as binary bits representing an integer part and a fractional part.

3. The method of claim 1, wherein converting further comprises:
determining, based on the received soft bits, the floating-point value as a mantissa and an exponent.

4. The method of claim 1, wherein converting further comprises:
determining an exponent based on a location of a most significant bit of the received soft bits; and
determining a mantissa using a sign bit and one or more bits adjacent to the most significant bit, the most significant bit being punctured from the mantissa to remove the bit, the floating-point value comprising the determined exponent and the determined mantissa.

5. The method of claim 1, further comprising:
receiving, from the buffer, a block to be decoded by a forward error correction (FEC) decoder, the block comprising a plurality of floating-point values, each of the plurality of floating-point values representing soft bits.

6. The method of claim 5 further comprising:
converting the block comprising the plurality of floating-point values to another block comprising a plurality of fixed-point values.

7. The method of claim 6, wherein converting further comprises:
inserting a bit representing a punctured bit, determining an average exponent based on a plurality of exponents, and inserting the mantissa into the fixed-point value.

8. The method of claim 7, wherein inserting further comprises:
inserting the mantissa at a location in the fixed-point value, the location determined based on the average exponent.

9. The method of claim 8, wherein inserting further comprises:
determining the location based on the average exponent and a scale factor representing a modulation type used during transmission of the block.

10. The method of claim 6 further comprising:
providing the other block comprising the plurality of fixed-point values to the forward error correction (FEC) decoder.

11. The method of claim 10 further comprising:
using, as the forward error correction (FEC) decoder, a convolution turbo code (CTC) decoder.

12. A system comprising:
means for receiving, from a demapper, soft bits formatted as a fixed-point value;
means for converting the soft bits from the fixed-point value to a floating-point value, the floating-point value punctured to remove a bit; and
means for providing the converted soft bits to a buffer to enable decoding of the buffered soft bits.

13. The system of claim 12, wherein the means for converting further comprises:
means for determining, based on the received soft bits, the floating-point value as a mantissa and an exponent.

14. The system of claim 12, wherein the means for converting further comprises:
means for determining an exponent based on a location of a most significant bit of the received soft bits; and
means for determining a mantissa using a sign bit and one or more bits adjacent to the most significant bit, the most significant bit being punctured from the mantissa to remove the bit, the floating-point value comprising the determined exponent and the determined mantissa.

15. A system comprising:
a demapper configured to provide soft bits formatted as a fixed-point value;
a first soft bit converter configured to receive, from the demapper, the soft bits formatted as the fixed-point value and to convert the soft bits from the fixed-point value to a floating-point value, the conversion including puncturing a bit of the floating-point value; and
a buffer configured to receive the converted soft bits to enable decoding of the buffered soft bits.

16. The system of claim 15, wherein the first soft bit converter further comprises:
converting the soft bits from the fixed-point value to the floating-point value by determining an exponent based on a location of a most significant bit of the received soft bits and determining a mantissa using a sign bit and one or more bits adjacent to the most significant bit, the most significant bit being punctured from the mantissa to remove the bit, the floating-point value comprising the determined exponent and the determined mantissa.

17. The system of claim 15 further comprising:
a second soft bit converter configured to receive, from the buffer, a block to be decoded by a forward error correction (FEC) decoder, the block comprising a plurality of floating-point values, each of the plurality of floating-point values representing soft bits.

18. The system of claim 17, wherein the second soft bit converter further comprises:
converting the block comprising the plurality of floating-point values to another block comprising a plurality of fixed-point values.

19. The system of claim 18, wherein the second soft bit converter further comprises:
converting the block to the other block by inserting a bit representing a punctured bit, determining an average exponent based on a plurality of exponents, and inserting the mantissa into the fixed-point value; and
providing the other block comprising the plurality of fixed-point values to the forward error correction (FEC) decoder.

* * * * *